United States Patent
Anwar et al.

(10) Patent No.: US 7,822,324 B2
(45) Date of Patent: Oct. 26, 2010

(54) LOAD LOCK CHAMBER WITH HEATER IN TUBE

(75) Inventors: Suhail Anwar, San Jose, CA (US); Jae-Chull Lee, San Jose, CA (US); Shinichi Kurita, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/782,290

(22) Filed: Jul. 24, 2007

(65) Prior Publication Data

US 2008/0118236 A1      May 22, 2008

Related U.S. Application Data

(60) Provisional application No. 60/822,378, filed on Aug. 14, 2006.

(51) Int. Cl.
*F26B 3/30* (2006.01)
(52) U.S. Cl. ........... 392/411; 392/424
(58) Field of Classification Search ........... 392/410, 392/411, 417, 420
See application file for complete search history.

(56) References Cited

U.S. PATENT DOCUMENTS

| | | | | |
|---|---|---|---|---|
| 4,543,472 A * | 9/1985 | Arai et al. | ...... | 219/411 |
| 5,345,534 A * | 9/1994 | Najm et al. | ...... | 392/422 |
| 5,740,314 A * | 4/1998 | Grimm | ...... | 392/420 |
| 5,937,142 A * | 8/1999 | Moslehi et al. | ...... | 392/416 |
| 6,121,581 A * | 9/2000 | Hegedus | ...... | 219/390 |
| 6,259,066 B1 * | 7/2001 | Touchais-Papet et al. | ...... | 219/411 |
| 6,301,434 B1 * | 10/2001 | McDiarmid et al. | ...... | 392/416 |
| 6,376,804 B1 * | 4/2002 | Ranish et al. | ...... | 219/390 |
| 6,566,630 B2 * | 5/2003 | Kitamura | ...... | 219/390 |
| 7,112,763 B2 * | 9/2006 | Hunter et al. | ...... | 219/411 |
| 7,127,367 B2 * | 10/2006 | Ramachandran et al. | ...... | 702/130 |
| 7,207,766 B2 | 4/2007 | Kurita | | |
| 2007/0006936 A1 | 1/2007 | Hosokawa | | |
| 2007/0086881 A1 | 4/2007 | Kurita | | |
| 2007/0166133 A1 | 7/2007 | Kee | | |
| 2007/0280816 A1 | 12/2007 | Kurita | | |
| 2008/0001113 A1 | 1/2008 | Kim | | |
| 2008/0087214 A1 | 4/2008 | Lee | | |

OTHER PUBLICATIONS

PCT International Search Report and Written Opinion dated Oct. 23, 2008 for International Application No. PCT/US2007/75699.

* cited by examiner

*Primary Examiner*—Thor S Campbell
(74) *Attorney, Agent, or Firm*—Patterson & Sheridan, LLP (57) ABSTRACT

Embodiments of the invention include a heated load lock chamber. In one embodiment, a heated load lock chamber includes a chamber body having a plurality of lamp assembles disposed at least partially therein. Each lamp assembly includes a transmissive tube housing a lamp. The transmissive tube extends into the chamber body and provides a pressure barrier isolating the lamp from the interior volume of the load lock chamber. In another embodiment, an open end of the transmissive tube extends through a sidewall of the chamber body. A closed end of the transmissive tube is surrounded by the interior volume of the chamber body and is supported below a top of the chamber body in a spaced apart relation. The open end of the tube is sealed to the sidewall of the chamber body such that the interior of the tube is open to atmosphere.

25 Claims, 11 Drawing Sheets

LOAD LOCK CHAMBER WITH HEATER IN TUBE

CROSS-REFERENCE TO RELATED APPLICATION

This application claims benefit of U.S. Provisional Patent Application Ser. No. 60/822,378, filed Aug. 14, 2006 which is incorporated by reference in its entirety.

This application is related to U.S. patent application Ser. No. 11/782,267, filed Jul. 24, 2007 by Lee, et al., entitled "Load Lock Chamber With Decoupled Slit Valve Door Seal Compartment", which is incorporated by reference in its entirety.

BACKGROUND OF THE INVENTION

1. Field of the Invention

Embodiments of the invention generally relate to a load lock chamber for a vacuum processing system, and more specifically, to a heated load lock chamber.

2. Description of the Related Art

Two rapidly evolving technology areas are thin film transistors and photovoltaic devices. Thin film transistors (TFT) formed by flat panel technology are commonly used for active matrix displays such as computer and television monitors, cell phone displays, personal digital assistants (PDAs), and an increasing number of other devices. Generally, flat panels comprise two glass plates having a layer of liquid crystal materials sandwiched therebetween. At least one of the glass plates includes one conductive film disposed thereon that is coupled to a power source. Power, supplied to the conductive film from the power source, changes the orientation of the crystal material, creating a pattern display.

Photovoltaic devices (PV) or solar cells are devices which convert sunlight into direct current (DC) electrical power. PV or solar cells typically have one or more p-n junctions formed on a panel. Each junction comprises two different regions within a semiconductor material where one side is denoted as the p-type region and the other as the n-type region. When the p-n junction of the PV cell is exposed to sunlight (consisting of energy from photons), the sunlight is directly converted to electricity through the PV effect. In general, a high quality silicon-based material is desired to produce high efficiency junction devices (i.e., high power output per unit area). Amorphous silicon (a-Si) film has been widely used as the silicon-based panel material in PV solar cells due to its low cost to manufacture in conventional low temperature plasma enhanced chemical vapor deposition (PECVD) processes.

With the marketplace's acceptance of flat panel technology and desire for more efficient PV devices to offset spiraling energy costs, the demand for larger panels, increased production rates and lower manufacturing costs have driven equipment manufacturers to develop new systems that accommodate larger size substrates for flat panel display and PV device fabricators. Current substrate processing equipment is generally configured to accommodate substrates slightly greater than about two square meters. Processing equipment configured to accommodate larger substrate sizes is envisioned in the immediate future.

Equipment to fabricate such large substrates represents a substantial investment to fabricators. Conventional systems require large and expensive hardware. In order to offset this investment, high substrate throughput is very desirable.

Heating and/or cooling of the substrate within the load lock chamber is an important aspect for achieving high system throughput. As future processing systems are envisioned to process even larger size substrates, the need for uniform rapid heating and cooling of large area substrates is of great concern. In particular, the deflection due to the large surface area exposed to vacuum presents a challenge in maintaining uniform spacing between the heaters, substrate and chamber body. Moreover, as electrical connections for conventional resistive heaters and lamp utilized to heat substrates within the load lock chambers are exposed to vacuum, the connections are subject to arcing which may damage the chamber hardware and/or generate particles which then become a source of unwanted contamination. As such, advancements which promote uniform temperature regulation, hardware longevity, contamination control and high heat transfer rates are highly desirable.

Thus, there is a need for an improved load lock chamber that facilitates rapid and uniform heating and cooling of larger area substrates.

SUMMARY OF THE INVENTION

Embodiments of the invention include a heated load lock chamber. In one embodiment, a heated load lock chamber includes a chamber body having a plurality of lamp assembles disposed at least partially therein. Each lamp assembly includes a transmissive tube housing a lamp. The transmissive tube extends into the chamber body and provides a pressure barrier isolating the lamp from the interior volume of the load lock chamber.

In another embodiment, a heated load lock chamber includes a chamber body having at least one lamp assembly. The lamp assembly includes a transmissive tube that houses a lamp therein. An open end of the transmissive tube is exposed to atmosphere through a sidewall of the chamber body. A closed end of the transmissive tube extends into and is surrounded by an interior of the chamber body. The closed end of the transmissive tube is supported in a spaced apart relation below a ceiling of the interior volume defined in the chamber body.

In another embodiment, a heated load lock chamber includes a chamber body having at least a first and second lamp assemblies. Each lamp assembly includes a transmissive tube that houses a lamp therein. An open end of the first transmissive tube of a first lamp assembly extends through the first sidewall of the chamber body. An open end of the second transmissive tube of the second lamp assembly extends through a second sidewall of the chamber body. Closed ends of the transmissive tubes extend toward each other into an interior of the chamber body. The tubes provide a pressure barrier isolating the lamps from the interior volume of the load lock chamber.

In another embodiment, a heated load lock chamber includes opposing transmissive tubes held by a single bracket installed to the ceiling. In yet another embodiment, a heated load lock chamber includes a plurality of opposing transmissive tubes pairs held by a long bar that extends the length of the chamber. The ends of the bar are attached to the chamber sidewalls only, thus decoupling the tubes from movement of the chamber ceiling.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

A load lock chamber suitable for efficient heating of large area substrates is provided. Although specific embodiments of load lock chambers are provided below with reference to a load lock chamber of a configuration available from Applied Materials, Inc., of Santa Clara, Calif., it is contemplated that the inventive features and methods may be adapted for use in other load lock chambers, including those from other manufacturers.

Figure 1:
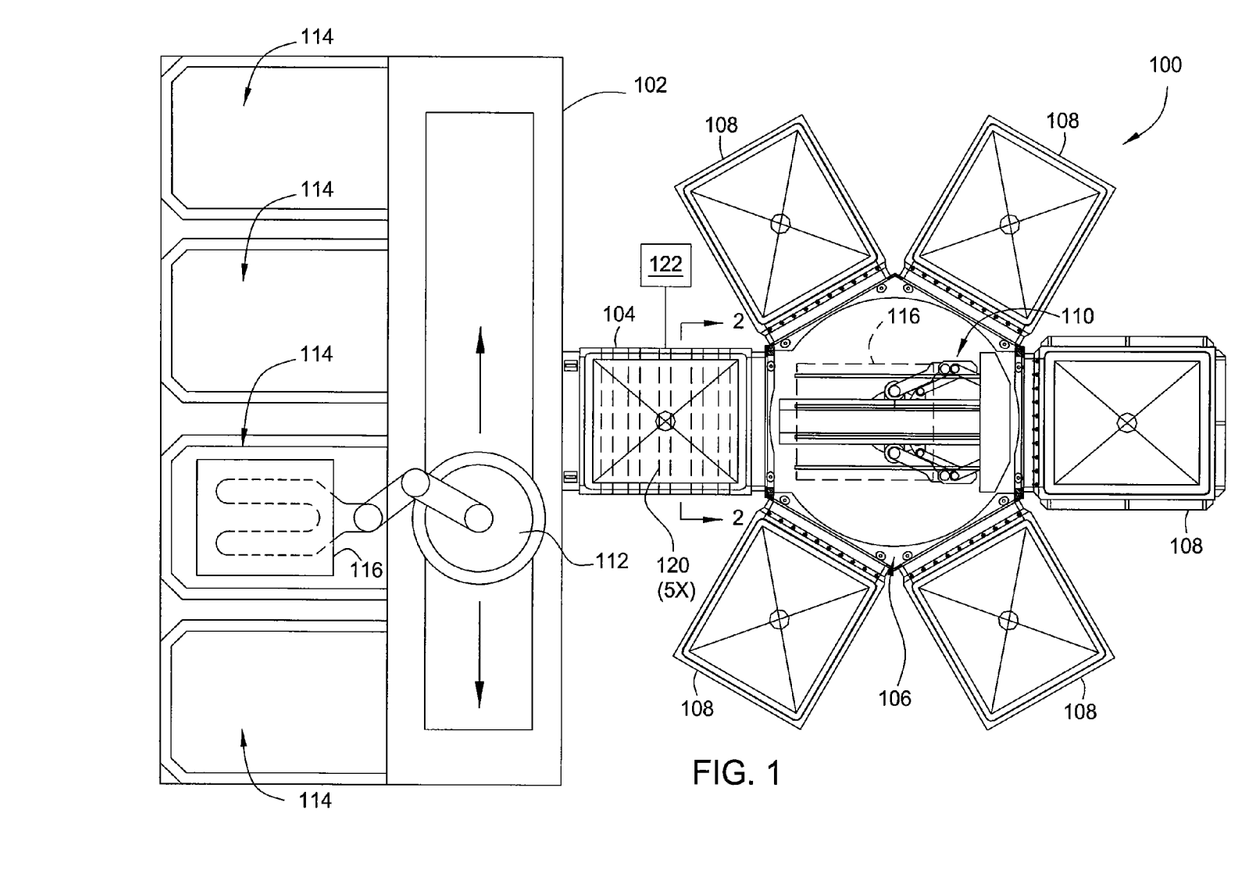
FIG. 1 is a plan view of an illustrative cluster tool having one embodiment of a load lock chamber of the present invention.

FIG. 1 is a plan view of an illustrative cluster tool 100 having one embodiment of a heated load lock chamber 104 of the present invention. The cluster tool 100 includes a factory interface 102 coupled by the load lock chamber 104 to a transfer chamber 106. The factory interface 102 generally includes a plurality of substrate storage cassettes 114 and an atmospheric robot 112. The atmospheric robot 112 facilitates transfer of substrates 116 between the cassettes 114 and the load lock chamber 104. A plurality of substrate processing chambers 108 are coupled to the transfer chamber 106. A vacuum robot 110 is disposed in the transfer chamber 106 to facilitate transfer of a substrate 116 between the load lock chamber 104 and the processing chambers 108.

The load lock chamber 104 generally includes at least one environmentally-isolatable cavity having one or more substrate storage slots defined therein. In some embodiments, a plurality of environmentally-isolatable cavities may be provided, each having one or more substrate storage slots defined therein. The load lock chamber 104 is operated to transfer substrates 116 between an ambient or atmospheric environment of the factory interface 102 and the vacuum environment maintained in the transfer chamber 106.

A plurality of lamp assemblies 120, shown in phantom in FIG. 1, extend across the load lock chamber generally perpendicular to the direction of travel of a substrate passing between the factory interface 102 and the transfer chamber 106 through the load lock chamber 102. The lamp assemblies 120 are coupled to a power source 122 so that substrates disposed in the load lock chamber 120 may be selectively heated. Although five lamp assemblies 120 are shown in the embodiment depicted in FIG. 1, it is contemplated that the load lock chamber 102 may be configured to contain more or less lamp assemblies 120, selected commiserate with heating requirements and geometry constraints.

Figure 2:
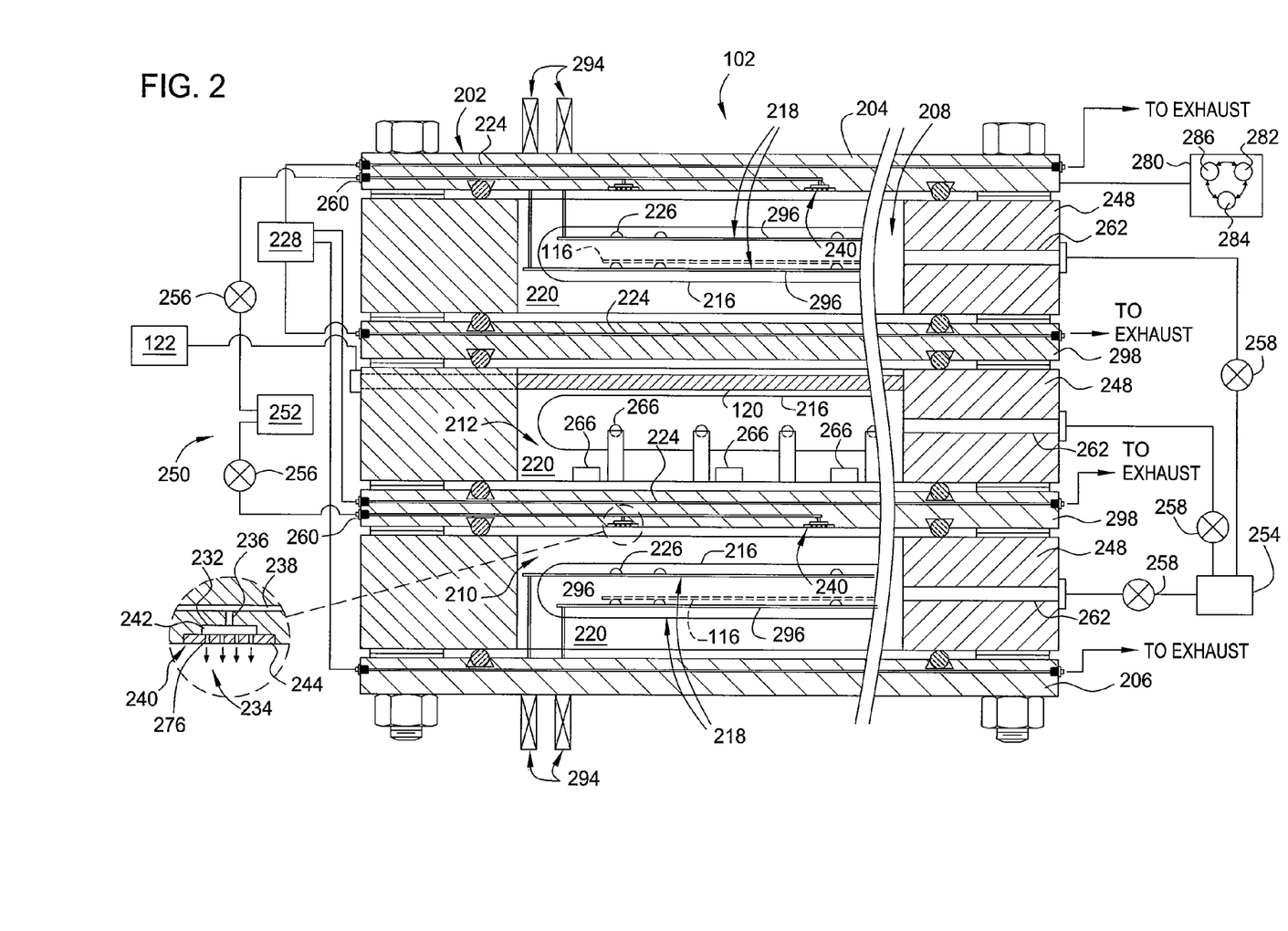
FIG. 2 is a sectional view of the load lock chamber taken along section line 2-2 of FIG. 1.

FIG. 2 depicts one embodiment of a load lock chamber 104 of the present invention having at least one lamp assembly 120. Although the load lock chamber 104 is shown having a plurality of substrate transfer cavities, one of which having a lamp assembly 120 disposed therein, it is contemplated that the lamp assembly 120 may be utilized in any load lock chamber having at least one cavity utilized for substrate transfer, including load lock chambers having capacity greater than a single substrate per cavity.

The load lock chamber 104 includes a body assembly 202 fabricated from a rigid material such as stainless steel, aluminum or other suitable material. The body assembly 202 may be fabricated from an assembly of components into a leak-free structure. One suitable body assembly that may be adapted to benefit from the invention is described in U.S. patent application Ser. No. 11/332,781, filed Jan. 13, 2006. Alternatively, the body assembly 202 may have other configurations and/or be fabricated from a single block of material. Other load lock chambers that may be adapted to benefit from the invention include U.S. patent application Ser. No. 11/332,781, filed Jan. 13, 2006, U.S. patent application Ser. No. 10/832,795, filed Apr. 26, 2004, U.S. patent application Ser. No. 09/663,862, filed Sep. 15, 2000, U.S. patent application Ser. No. 10/842,079, filed May 10, 2004, and U.S. patent application Ser. No. 11/421,793, filed Jun. 2, 2006, among others. All of said United States Patent Applications are incorporated herein by reference in their entireties.

In one embodiment, the body assembly 202 includes a top plate 204 and a bottom plate 206 that sandwich a plurality of ring-shaped bodies 248. Interior plates 198 are disposed between the bodies 248. The plates 204, 206, 298 enclose internal volumes 220 defined inside each of the bodies 248. In the embodiment depicted in FIG. 2, the upper and lower internal volumes 220 are configured as substrate transfer cavities 208, 210, while the internal volume 220 bounded by the middle body 248 is configured as a heating cavity 212.

In the embodiment depicted in FIG. 2, the lamp assemblies 120 are shown disposed in the heating cavity 212. However, the lamp assemblies may be alternatively disposed in one of the other transfer cavities 208, 210 or in any combination of the cavities 208, 210, 212.

The top and bottom plates 204, 206 are sealingly coupled to the bodies 248 by a plurality of fasteners in a manner that permits relative movement between at least one of the top and bottom plates 204, 206 and the body 248. For example, at least one of the top and bottom plates 204, 206 are coupled to the body 248 without welding. In embodiments wherein force applied to the sidewalls from the plates 204, 206 is not of great concern, the top and bottom plates 204, 206 and the body 248 may be coupled by welding.

Figure 3:
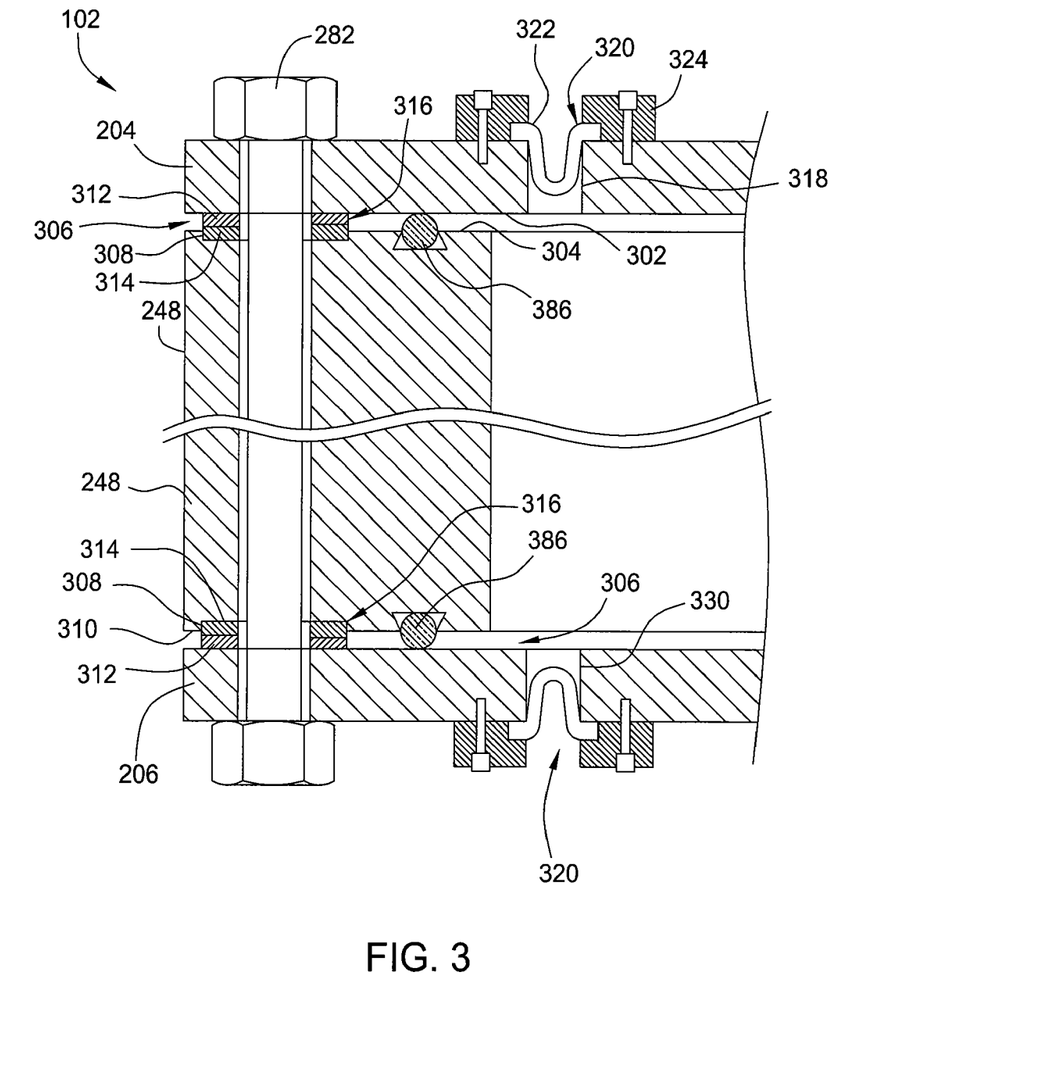
FIG. 3 is a partial sectional view of the load lock chamber of FIG. 1.

Referring additionally to a partial sectional view of the body assembly 202 depicted in FIG. 3, at least one spacer 316 is provided between a lower surface 302 of the top plate 204 and an upper surface 304 of the body 248. The spacer 316 separates the top plate 204 and chamber body 248, such that a gap 306 is defined therebetween. In one embodiment, the spacer 316 is a member having a plan area much smaller than the plan area of the upper surface 304 of the chamber body 248. For example, a plurality of spacers 316 may be disposed on upper surface 304 along one side of the chamber body 248.

The thickness of the spacer 316 is selected such that a gasket or o-ring 386 is adequately compressed to maintain a vacuum seal between the plates and body, while preventing the top plate 204 from contacting the chamber body 248 under vacuum or other stress conditions. Similarly, one or more spacers 316 are provided between the bottom plate 206 and the chamber body 248 to maintain a gap 306 therebetween.

In the embodiment depicted in FIG. 3, a first spacer 312 and a second spacer 314 are shown disposed between the top plate 204 and the chamber body 248. The spacers 312, 314 are fabricated from a material having a lower coefficient of friction between itself (i.e., spacer 312 to spacer 314) than a coefficient of friction between the spacer and the chamber body 248 and/or top plate 204. Thus, as the chamber body 248 and the top plate 204 move relative to each other due to vacuum, thermal or other forces, the top plate 204 and first spacer 312 are free to translate laterally across the second spacer 314 (and body 248) while preventing the top plate 204 and body 248 from touching.

In one embodiment, the spacers 312, 314 are disks. The disks may be washers disposed around the bolts 282 utilized to secure the body assembly 202 for ease of assembly. As the sliding components (e.g., the spacers 312, 314) have reduced contact area relative to the upper surface 304 of the body 248, the force necessary to begin motion is reduced. Additionally, as the contacting surface of the spacers 312, 314 are outward of the gasket 286, any particles generated during the sliding of the spacers 312, 314 are beneficially prevented from entering the internal volume 220 of the load lock chamber 104. It is contemplated that the spacers 316 may be in the form of a rib or other feature, extending between the plates and body to maintain a gap therebetween. It is also contemplated that the spacer may be incorporated into either the plates or body. It is contemplated that the spacers 316 may be in the form of a rib or other feature extending between the plates and body to maintain a gap therebetween. It is also contemplated that the spacer may be incorporated into either the plate or body (i.e., have unitary construction).

In the embodiment depicted in FIG. 3, a recess 308 is formed in the upper surface 304 of the body 248 to locate the second spacer 314. Optionally, a recess (not shown) may be formed in the top plate 204 to locate the first spacer 312. The recess (not shown) 308 has a depth selected, such that the spacer 314 extends beyond the upper surface 304 to ensure the first spacer 312 is free to slide laterally relative to the body 248.

To further minimize the effect of forces exerted on the top plate 204 of the load lock chamber 104, at least one slot 318 is formed therein. The slots 312 allow the central region of the top plate 204 to move, deflect and/or expand while minimizing the effect of motion on the edges of the top plate. A seal assembly 320 disposed in the slot 318 to prevent leakage into interior volume 220 of the load lock chamber 104. In the embodiment depicted in FIG. 3, the seal assembly 320 includes gasket or bellows 322 clamped to the top plate 204 by a clamp block 324. Similarly, the bottom plate 206 includes at least one slot 330 sealed by a seal assembly 320, as described above. The bellows 322 may be protected with a cover (not shown) to prevent broken glass or other debris from damaging the bellows 322.

Returning back to FIG. 2, two substrate access ports 216 are formed through opposing sidewalls of the bodies 248 to allow entry and egress of substrates from the internal volume 220 of the substrate transfer cavities 208, 210. Only one of the ports 216 are shown in FIG. 2. The heating cavity 212 includes at least one substrate access port 216 defined on a side of the body 248 that is coupled to the transfer chamber 106 so that the interior volume 220 of the transfer cavity 212 may be accessed by the vacuum robot 110 (shown in FIG. 1). The substrate access ports 216 are selectively sealed by slit valve doors, which are well known in the art. One slit valve door that may be adapted to benefit from the invention is described in U.S. patent application Ser. No. 10/867,100, entitled CURVED SLIT VALVE DOOR, filed Jun. 14, 2004 by Tanase, et al., and is incorporated by reference in its entirety.

The heating cavity 212 may optionally have a second substrate access port (not shown in FIG. 2). The second substrate access port may be selectively sealed by a slit valve door, or alternatively sealed by a blank plate since the substrate access port is primarily used for cavity maintenance.

In one embodiment, at least one of the plates 204, 206, 298 may be configured as a temperature regulating plate. One or more passages 224 may be formed in the plates 204, 206, 298 and coupled to a fluid source 228. The fluid source 228 provides a heat transfer fluid that is circulated through the passages 142 to regulate (i.e., heat and/or cool) the temperature of the plates 204, 206, 298 and ultimately, the temperature of the substrate 116. By cooling the plates 204, 206, 298, hot substrates returning from processing may be effectively cooled without utilizing a separate conventional cooling plate disposed within the cavities 208, 210.

The heating cavity 212 generally includes one or more lamp assemblies 120 disposed through the internal volume 220 that are selectively utilized to heat the substrate 116. In the sectional view depicted in FIG. 2, one lamp assembly 120 is shown extending between the side walls of the body assembly 202. Each lamp assembly 120 may be coupled to the power source 122 such that each lamp assembly disposed in the internal volume 120 may be independently controlled, thereby allowing the temperature profile of the substrate 116 to be tailored as desired, for example, by uniformly heating and/or by heating one region of the substrate faster than a second region. In one embodiment, the lamp assemblies 120 are arranged and/or controlled such that the center of the substrate 216 is heated at a rate different than the perimeter of the substrate. The heating rate may be greater in the center relative to the perimeter or vise versa.

Figure 4A:
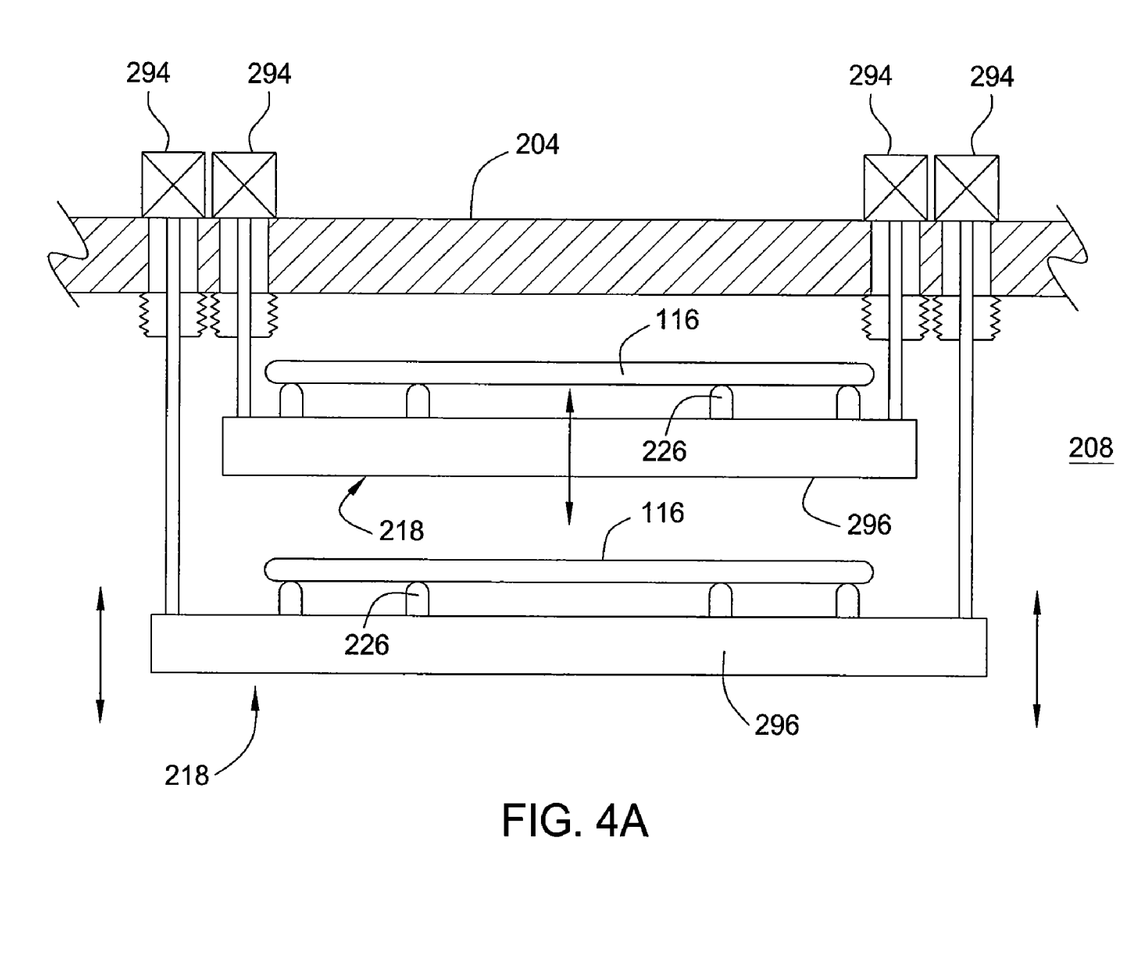
FIG. 4A is another partial sectional view of the load lock chamber of FIG. 1.

Referring to FIGS. 2 and 4A, a plurality of substrate support structures 218 are disposed in the internal volumes 220 of the transfer cavities 208, 210. The substrate support structures 218 are generally configured to each support a single substrate. The elevation of the support structures 218 is selectively controlled such that the proximity of substrate to the cooled plates (or lamp assembly 120) may be selectively adjusted. The elevation of the support structures 218 may also be controlled to facilitate substrate exchange through the ports 216. In one embodiment, each substrate support 218 is coupled to one or more actuators 294 so that the elevation of the respective supports 218 within each cavity may be independently controlled. It is contemplated that other substrate support structures may alternatively be used.

In one embodiment, the substrate support structure 218 includes a plate or plurality of bars 296 coupled to the actuators 294. The bars 296 are configured to span beyond the underside of the substrate supported thereon to facilitate coupling of the bar to the actuator 294.

A plurality of pins 226 may extend from the bars 296 to support the substrate 116 thereon. The ends of the pins 226 supporting the substrate 116 may be rounded and/or include a ball to reduce dynamic friction between the bottom surface of the substrate 116 and the pins 226 and to prevent substrate scratching. In the embodiment depicted in FIG. 2, a ball is disposed at a distal end of each pin 226. The reduced friction provided by the balls allows the substrate to readily expand and contract while supported on the pins 226 without scratching the substrate. Other suitable substrate supports are described in U.S. Pat. No. 6,528,767, filed Mar. 5, 2003; U.S. patent application Ser. No. 09/982,406, filed Oct. 27, 2001; and U.S. Patent Application No. 60/376,857, filed Feb. 27, 2003, all of which are incorporated by reference in their entireties. The pins 226 are generally arranged to facilitate substrate exchange with a robotic end effector. Pins 226 are additionally coupled to the interior plate 298 forming the floor of the heating cavity 212 to support a substrate therein.

To enhance heat transfer between the substrate and the chamber body 248, the substrate supports 218 may move the substrate support thereon proximate the floor (or ceiling) of the transfer cavities 208, 210. The distance between the substrate and transfer cavity floor/ceiling may be adjusted based on the temperature of the substrate. For example, hot substrate returning from pressing may have temperatures in excess of 240 degrees Celsius. To prevent condensation and/or thermal stress for forming, the hot substrate may be maintained at a large distance from the transfer cavity floor/ceiling. Once the hot substrate has been sufficiently cooled, for example to about 140 degrees Celsius, the cooler substrate may be moved closer to the transfer cavity floor/ceiling to increase the heat transfer efficiency, thereby allowing cooler substrate temperatures to be obtained at a faster rate, which also enhances substrate throughput.

To further enhance heat transfer between the substrate and the floor/ceiling of the transfer cavities 208, 210, the substrate supports 218 may be configured to interfit with the floor and/or ceiling of the transfer cavity. This allows the distance between the substrate and chamber body assembly 202 to be minimized, and in some embodiments, to place the substrate in contact with the chamber body assembly 202 to take full advantage of thermal exchange with the heat transfer fluid running through the passages 224.

Figure 5:
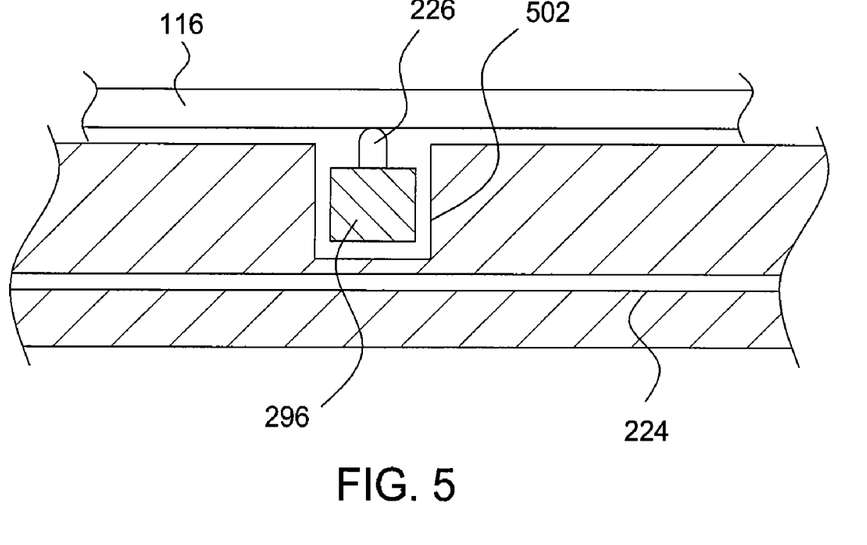
FIG. 5 is another partial sectional view of the load lock chamber of FIG. 1.

FIG. 5 depicts a sectional view of one embodiment of the interior plate 298 configured to interfit with the substrate support 218. The plate 298 includes slots 502 (one is shown in FIG. 5) that are configured to allow the bar 296 of the substrate support 218 to be moved therein. In one embodiment, the depth of the slot 502 may be selected to allow the substrate to be lifted from the pins 226 by the plate 298 as the bar 296 moves to the bottom of the slot 502. Alternatively, the slot 502, or motion of the bar 296, may be configured to maintain the substrate 116, supported on the pins 226, in close proximately to the plate such the substrate is efficiently cooled by the fluid circulating through the passages 224. The second transfer cavity 210 is similarly configured with slots 502 formed in the lower portion of the bounding internal plate 298.

Figure 4B:
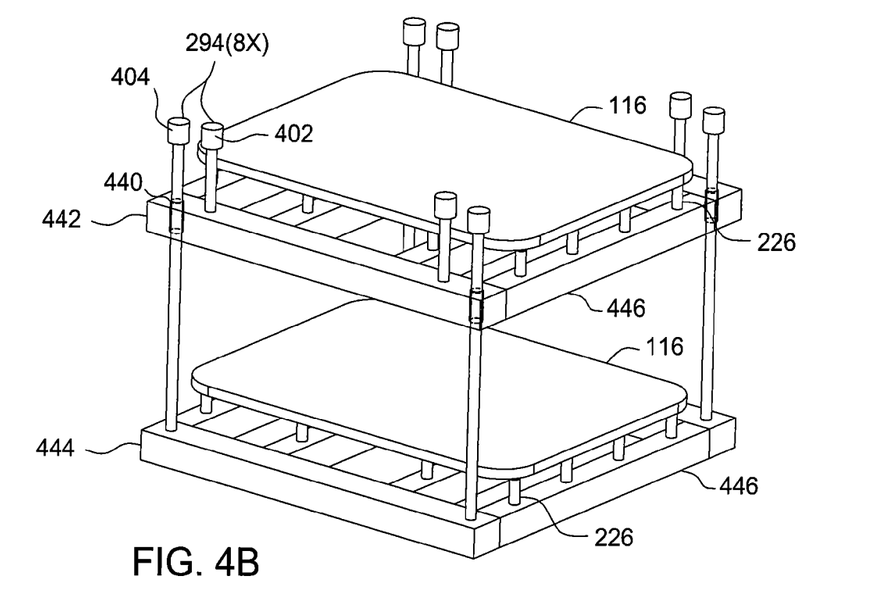
FIG. 4B is a partial isometric view of another embodiment of an interior of a load lock chamber.
Figure 4C:
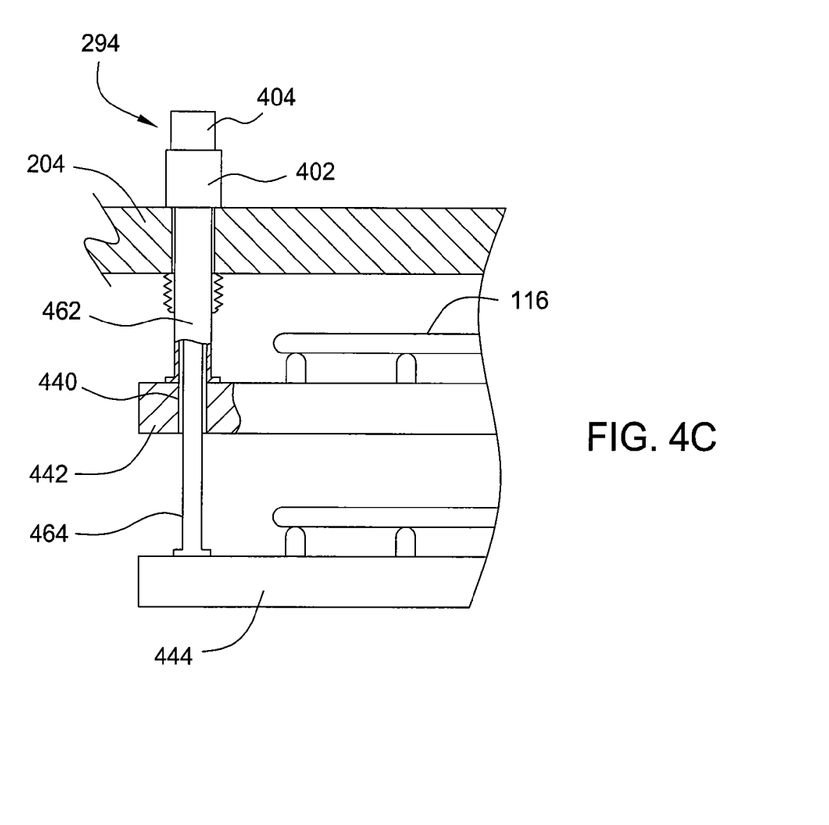
FIG. 4C is a partial sectional view of another embodiment of an interior of a load lock chamber.

FIG. 4B is a partial isometric view of another embodiment of an interior of the load lock chamber. In the embodiment depicted in FIG. 4B, the actuator 404 which controls the elevation of the lower substrate support 444 passes through a feature 440 formed in the upper substrate support 442, thereby enabling the actuators 402, 406 to be aligned. Thus, the substrate supports 442, 444 may be configured to have the same projected surface area (e.g., footprint) within the interior volume of the load lock chamber, thereby enabling the walls of the load lock chamber body to be disposed closer to the substrate supports 442, 444, which reduces the interior volume of the load lock chamber beneficially resulting in lower pumping and venting times. In the embodiment depicted in FIG. 4B, the feature 440 is a hole formed through the upper substrate support 442. It is contemplated that the feature 440 may alternatively be a notch, a groove, a slot, cut-out or other geometric disparity between the upper and lower substrate supports 442, 444 which enable the actuator 440 controlling the elevation of the lower substrate support 444 to be coupled to the lower support plate 444 without obstruction by upper substrate support 442. It is also contemplated that pairs of the actuators 402, 404 may be concentrically aligned, with the actuation rod 464 of the lower actuator telescoping through the rod 462 of the upper actuator 402 and the feature 440 of the upper substrate support 442, as shown in FIG. 4C.

Returning again to FIG. 2, a pressure control system 250 is coupled to the load lock chamber 104 to control the pressure within the internal volumes 220 of the body assembly 202. The pressure control system 250 generally includes a gas source 252 and an exhaust system 254. The gas source 252 is coupled to at least one inlet port 260 formed through the chamber body assembly 202. The gas source 252 provides a vent gas utilized to raise and/or regulate pressure within the internal volume 220 of the chamber body assembly 202. For example, the gas source 252 may flow vent gas into the internal volumes 220 of the transfer cavities 208, 210 to facilitate transfer of the substrate 116 from a vacuum environment to an ambient environment. In one embodiment, the vent gas comprises at least one of nitrogen, helium, air or other suitable gas. Optionally, the heating cavity 212 may not include an inlet port as, in one embodiment, the cavity 212 may be constantly maintained at operational vacuum pressure.

An inlet control valve 256 is disposed between the gas source 252 and the inlet port 260 to selectively control the flow of vent gases into the internal volumes 220 of the body assembly 202. The inlet control valve 256 is capable of providing a substantially leak-tight seal under vacuum conditions. In one embodiment, the gas source 252 is configured to control the attributes of the vent gas, such as the flow rate, temperature and/or humidity of the vent gas.

In the embodiment depicted in FIG. 2, the inlet port 260 is coupled to one or more diffusers 240 by a vent passage 238. The diffusers 240 are formed in an interior side of the top plate 204 (or other plate), such that gas flowing into the internal volume 220 is directed toward the top of the substrate 116. This arrangement beneficially assists in cooling the substrate 116 while venting the load lock chamber 104 after processing the substrate 116.

In one embodiment, the diffuser 240 is formed in a recess 232 defined in the bottom surface of the plates 204, 298. A cap 244 covers the recess 232 to define a plenum 242 in the plates. A connecting hole 236 fluidly couples the plenum 242 to the vent passage 238. A plurality of apertures 276 are formed through the cap 244 to allow vent gases to flow from the gas source 252 through plenum 242 and into the interior volume 220, as illustrated by arrows 234. Although the diffusers 240 are primarily intended to direct venting gases into the load lock chamber 104, it is contemplated that the diffusers 240 may also be utilized to evacuate the internal volume 220 of the chamber 104.

The exhaust system 254 is generally coupled to at least one exhaust port 262 formed through the chamber body assembly 202. The exhaust system 254 is configured to remove gases from the internal volume 220 of the load lock chamber 104.

The exhaust system 254 may include one or more vacuum pumps (not shown) and may be ultimately coupled to the facilities exhaust system (also not shown). For example, the exhaust system 254 may pump out gas from the internal volume 220 to facilitate transfer of the substrate 116 from an ambient environment to a vacuum environment.

An exhaust control valve 258 is disposed between the exhaust system 254 and the exhaust port 262 to selectively control the flow of gases exiting the internal volume 220 of the body assembly 202. The exhaust control valve 258 is typically similar to the inlet control valve 256 and is capable of providing a substantially leak-tight seal under vacuum conditions.

A controller 280 is coupled to the load lock chamber 104 to control the operation thereof. The controller 280 includes a central processing unit (CPU) 282, support circuits 286 and memory 284. The CPU 282 may be one of any form of computer processor that can be used in an industrial setting for controlling various chambers and subprocessors. The support circuits 286 are coupled to the CPU 282 for supporting the processor in a conventional manner. These circuits include cache, power supplies, clock circuits, input/output circuitry, subsystems, and the like. The memory 284 is coupled to the CPU 112. The memory 284, or computer-readable medium, may be one or more of readily available memory such as random access memory (RAM), read only memory (ROM), floppy disk, hard disk, or any other form of digital storage, local or remote.

Figure 6A:
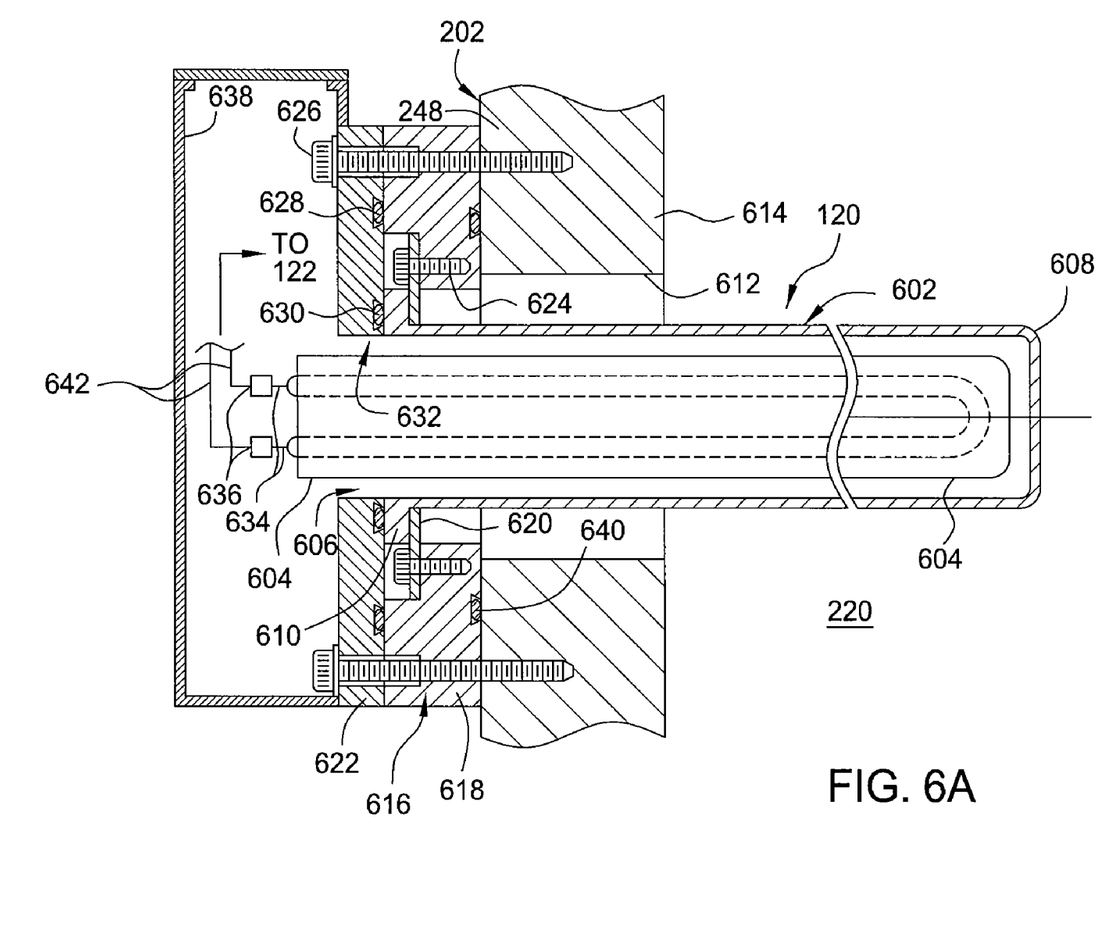
FIG. 6A is a partial sectional view of the load lock chamber of FIG. 1 illustrating one embodiment of a lamp assembly.

FIG. 6A is a partial sectional view of the load lock chamber 104 illustrating one embodiment of the lamp assembly 120. The lamp assembly 120 generally includes a tube 602 housing a lamp 104. The lamp 104 may be a carbon IR lamp or other lamp suitable for radiantly heating the substrate disposed in the internal volume 220.

The upper surface of the lamp 604 and/or tube 602 may be coated with a reflective material so that the energy generated by the lamp 604 is directed downward to the substrate to increase heating efficiency. In one embodiment, the coating comprises gold.

The tube 602 is generally fabricated from a transmissive material suitable to allow radiant heat generated by the lamp 604 to effectively heat the substrate 116 disposed in the internal volume 220 of the body assembly 202. In one embodiment, the tube 602 is fabricated from quartz. The diameter and thickness of the tube 602 is generally selected to prevent collapse due to the pressure differential experiences when the tube 602 is surrounded by vacuum conditions.

The tube 602 generally includes an open end 606 and a closed end 608. The tube 602 is disposed through an aperture 612 formed through a sidewall 614 of the body 248. The tube 602 includes a flared flange 610 defined at the open end 606. The closed end 608 generally extends into the interior volume 220 defined in the body assembly 202.

The tube 602 is coupled to the body assembly 202 by a mounting assembly 616. The mounting assembly 618 generally includes a mounting block 618, a retainer 620 and a cap 622. The mounting assembly 616 generally includes an aperture 632 through which the closed end 608 of the tube 602 extends.

The retainer 620 is generally annular in form and is coupled to the mounting block 618 by a plurality of fasteners 624. The inside diameter of the retainer 620 is generally less than an outside diameter of the flange 610 of the tube 602. This prevents the open end 606 of the tube 602 from passing through the aperture 632 and into the interior volume 220 of the body assembly 202.

The cap 622 is coupled to the mounting block 618 by a plurality of fasteners 626. The cap 622 captures the flange 610 of the tube 602 against the retainer 620. A first seal 628 is disposed between the cap 622 and the mounting block 618. A second seal 630 is disposed between the cap 622 and the flange 610 of the tube 602. A third seal 640 is disposed between the mounting block 618 and the body 248. As the fasteners 626 compress the cap 622 to the mounting block 618 and the mounting block 618 to the body 248, the seals 628, 630, 640 are compressed to provide a vacuum seal, thereby isolating the interior volume 220 from the exterior of the body assembly 202. Moreover, the second seal 630 disposed between the tube 602 and the mounting assembly 616 fluidly isolates the interior of the tube 602 from the interior volume of the body assembly 202.

Since the lamp assembly 120 is supported primarily from the walls of the body assembly 202 that have less area than the top or bottom, movement of the lamp assembly 120 due to pressure changes and/or body deflection is minimized. Moreover, spacing between the substrate and lamp assembly 120 is maintained at a substantially uniform distances The open end 606 of the tube 602 is exposed to the atmosphere outside of the chamber body 202, thereby allowing the lamp 204 to be inserted and/or replaced from the tube 602 without exposing the interior volume 220 of the load lock chamber to the ambient environment. Additionally, the lamp 604 includes leads 634 which may be coupled by a connector 636 and wires 642 outside of the interior volume 220 (e.g., at ambient pressures), thereby diminishing the probability of arcing and associated particle generations. Moreover, any particles associated with the lamp or the lamps electrical connections are fluidly isolated from the substrate, thereby eliminating the chance of particle contamination from these sources.

The wires 642 may be routed through a chase 638 or other wire conduit disposed outside the chamber body 202. The chase 638 allows multiple lamp assemblies 120 extending into the interior volume 220 to be serviced from a single location.

Figures 6B, 6C:
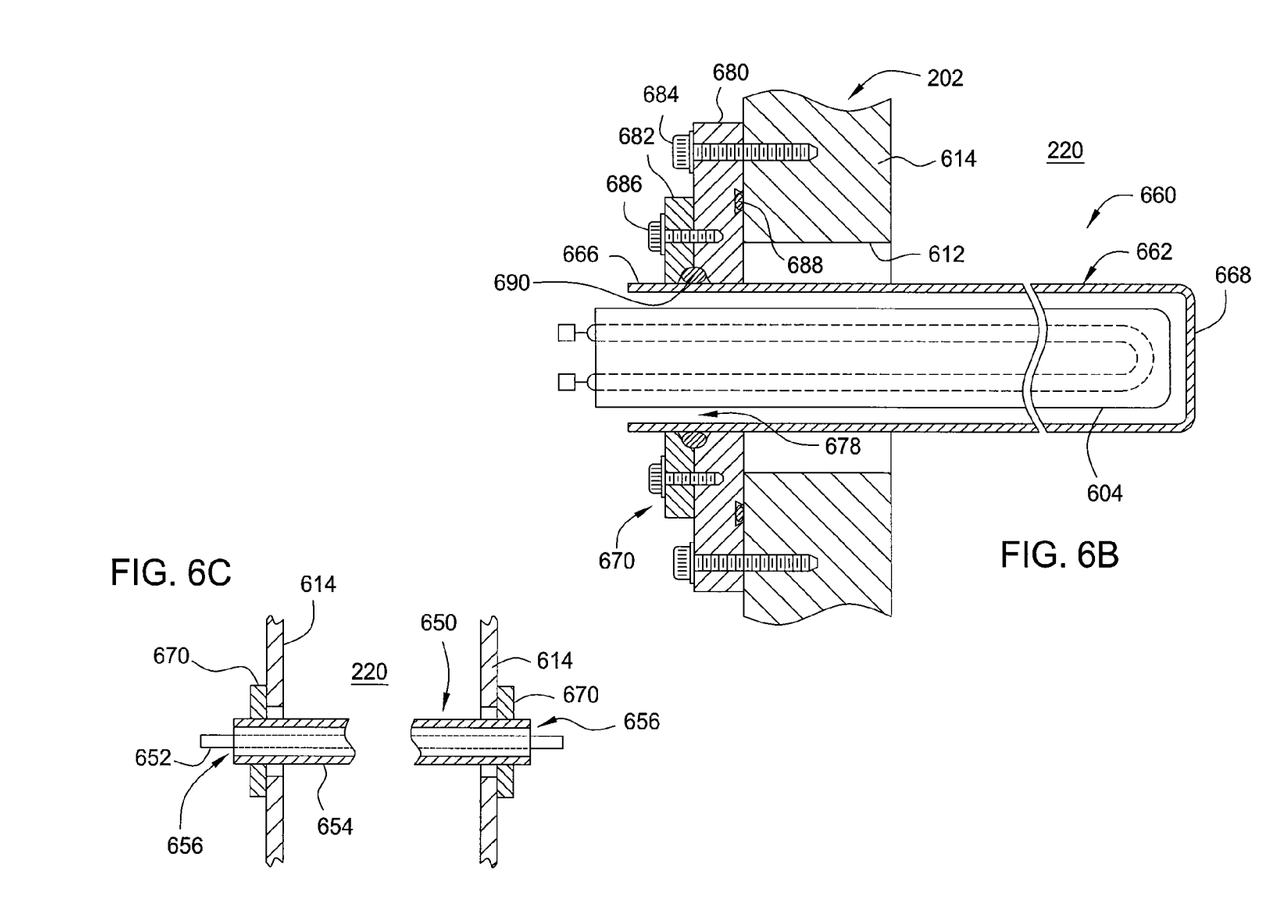
FIG. 6B is a partial sectional view of the load lock chamber of FIG. 1 illustrating another embodiment of a lamp assembly.
FIG. 6C is a partial sectional view of the load lock chamber of FIG. 1 illustrating another embodiment of a lamp assembly.

FIG. 6B is a partial sectional view of the load lock chamber 104 illustrating another embodiment of a lamp assembly 660. The lamp assembly 660 generally includes a tube 662 housing a lamp 604. The tube 662 generally includes an open end 666 and a closed end 668. The closed end 668 generally extends into the interior volume 220 defined in the body assembly 202. The tube 662 is disposed through an aperture 612 formed through a sidewall 614 of the body 248.

The tube 662 is coupled to the body assembly 202 by a mounting assembly 670. The mounting assembly 670 generally includes a mounting block 680 and a seal retainer 682. The mounting assembly 670 generally includes an aperture 678 through which the closed end 668 of the tube 662 extends.

The mounting block 680 is generally annular in form and is coupled to the wall 614 by a plurality of fasteners 684. The inside diameter of the mounting block 680 is generally greater than an outside diameter of the tube 662.

The seal retainer 682 is coupled to the mounting block 680 by a plurality of fasteners 686. The seal retainer 682 captures a first seal 690 between tube 662 and the mounting block 680. The first seal 690 prevents leakage between the mounting assembly 670 and the tube 662.

A second seal 630 is disposed between the mounting block 680 and the body 248. As the fastener 684 urge the mounting block 618 against the body 248, the seal 684 is compressed to provide a vacuum seal, thereby isolating the interior volume 220 from the exterior of the body assembly 202.

The open end 666 of the tube 662 is exposed to the atmosphere outside of the chamber body 202. Thus, the lamp 204 may be inserted and/or replaced from the tube 662 without exposing the interior volume 220 of the load lock chamber to the ambient environment.

FIG. 6C is a partial sectional view of the load lock chamber 104 illustrating another embodiment of a lamp assembly 650. The lamp assembly 650 generally includes a tube 654 housing one or more lamps 652. The tube 654 generally includes two open ends 656 which are disposed or at least open to the exterior of the chamber. The middle of the tube 654 generally extends through the interior volume 220 defined in the body assembly 202. The tube 662 is disposed through apertures formed through the sidewalls 614 of the body 248. Each open end 656 of tube 662 is sealed to a respective sidewall 614 of the body 248 by a mounting assembly 670, as described above.

The tube 662 may house one lamp 652 extending substantially therethrough, or may house a plurality of lamps 652 therein. The lamps 652 may be accessed from either open end 656 of the tube 654.

Figure 7:
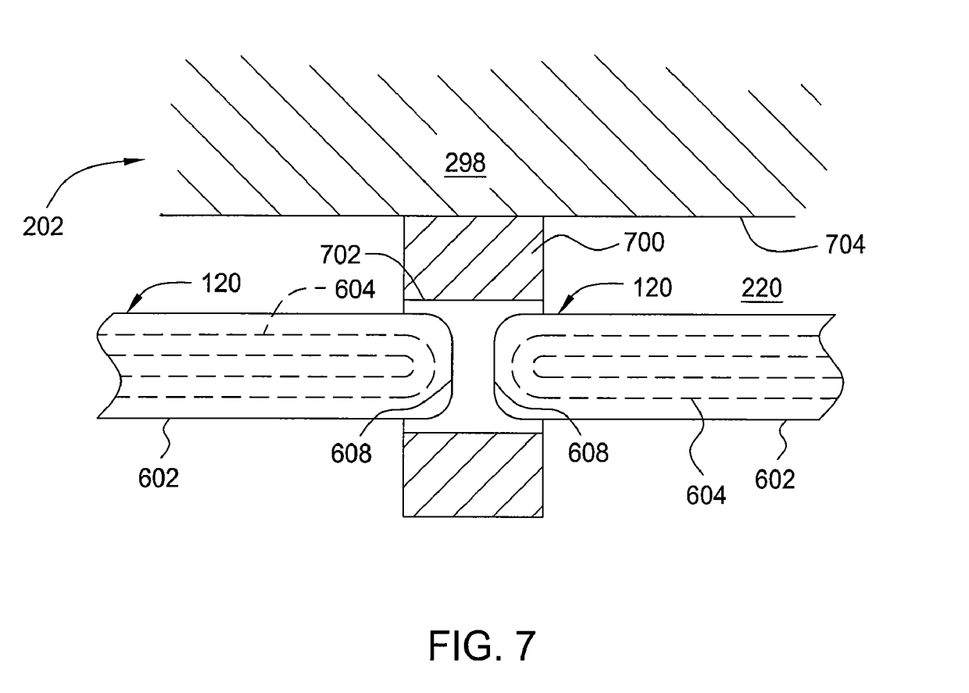
FIGS. 7-8 are a partial sectional view of a closed end of the lamp assembly supported in a load lock chamber.
Figure 8:
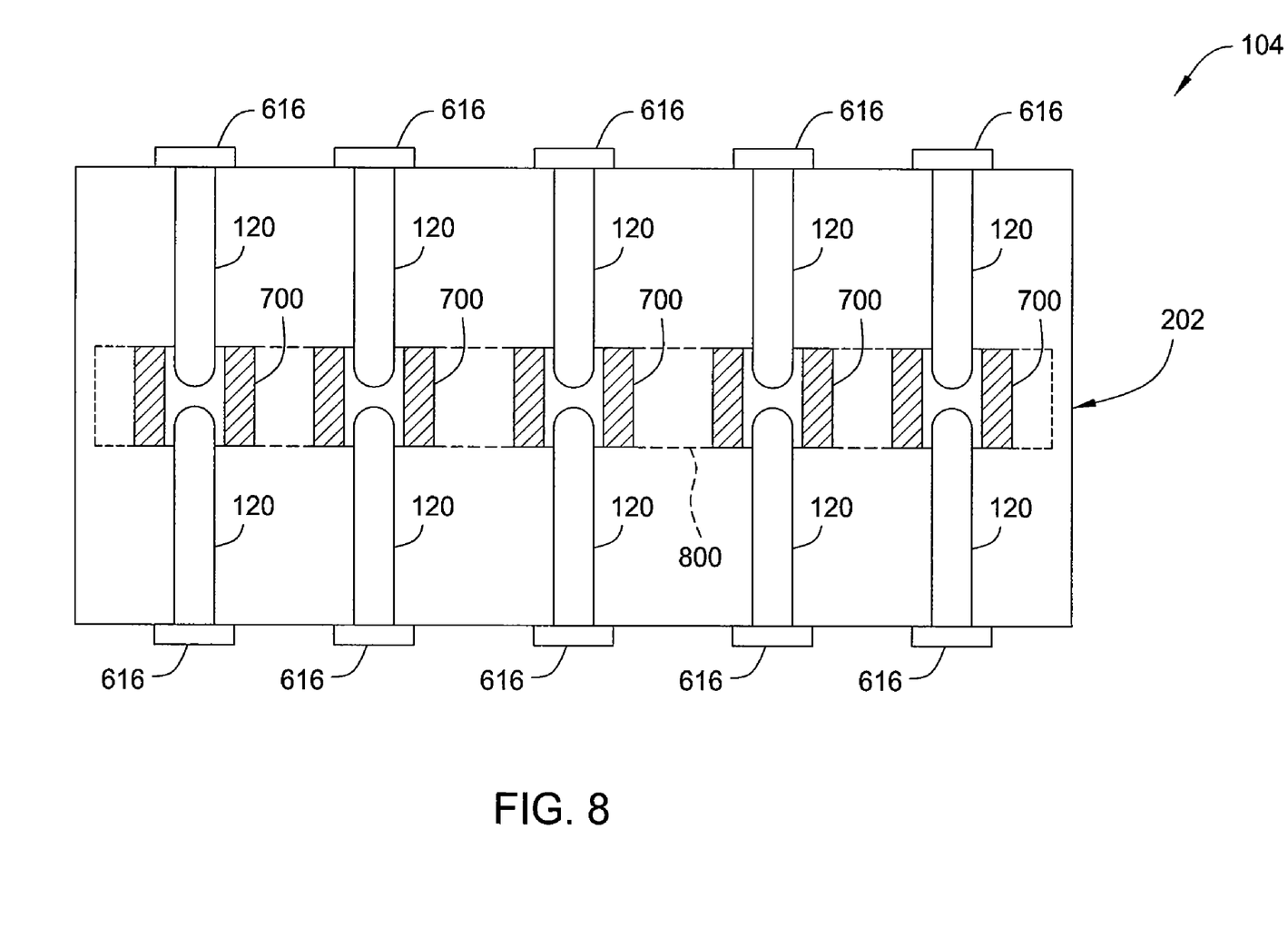

FIGS. 7-8 are partial sectional view of the closed end 608 of the lamp assembly 120 supported within the chamber body 202. In the embodiment depicted in FIGS. 7-8, multiple pairs of lamp assemblies 120 are arranged in rows. Each lamp assembly 120 defining a pair extends through apertures (612) formed through facing sidewalls 614 of the load lock chamber 104. Each pair of lamp assemblies 120 have their closed ends 608 supported by a guide 700. As shown in phantom line in FIG. 8, the guides 700 may be in the form of a singular bar 800 spanning the length of the chamber. The ends 840 of the singular bar 800 may be coupled solely to opposing sidewalls such of the body 248 such that the movement of the ceiling is decoupled from the lamp assemblies 120, thereby maintaining substantially constant spacing between the lamp assemblies and the substrate. The opposing lamp assembly configuration that spans the interior volume of the chamber body shorter lamps 604 to be used in the tube 602. The shorter lamps 604 (i.e., less than an interior chamber width) requires less clearance during lamp replacement. The short lamp feature is advantageous due to the close proximity of the processing chambers 108 adjacent the sidewalls of the load lock chamber 104, as shown in FIG. 1.

In the embodiment depicted in FIG. 7, the closed ends 608 of the tubes 602 are supported by a guide 700. The guide 700 includes a hole 702 which receives the closed ends 608 of the tube 602. Each hole 702 has a chamfer and radius to prevent tube 602 from being scratched and acting as guide during installation. It is contemplated that dedicated guides may be used for each tube 602, for two tubes 602 as shown in FIGS. 7-8, or for a plurality of opposing tube pairs as shown in phantom in FIG. 8. In one embodiment, the hole 702 has sufficient clearance with the tube 602 to ensure the lamp assembly 120 is supported in a cantilevered orientation from the sidewalls, thereby enhancing uniform lamp-to-substrate spacing uniformity.

The guide 700 is generally coupled to a ceiling 704 of the internal volume 220. The guide 700 holds the lamp assembly 120 in a space apart relation with the ceiling 704. In the embodiment depicted in FIG. 7, the ceiling 704 is the underside of the interior plate 298. In other embodiments, the guide may be coupled to the bottom of the top plate 204, a bottom plate 206, or other portion of the body assembly 202.

Figure 9:
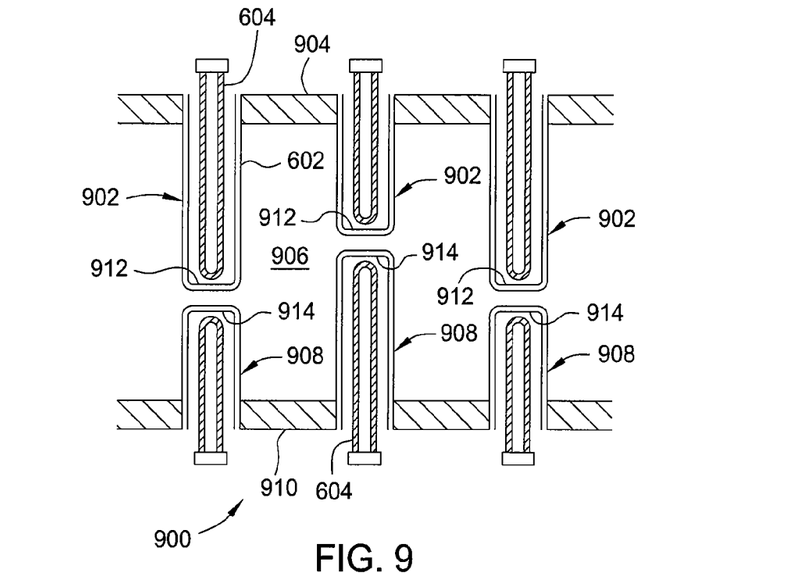
FIGS. 9-11 are partial sectional views of different embodiments of a load lock chamber having a plurality of lamp assemblies supported therein.
Figures 10, 11:
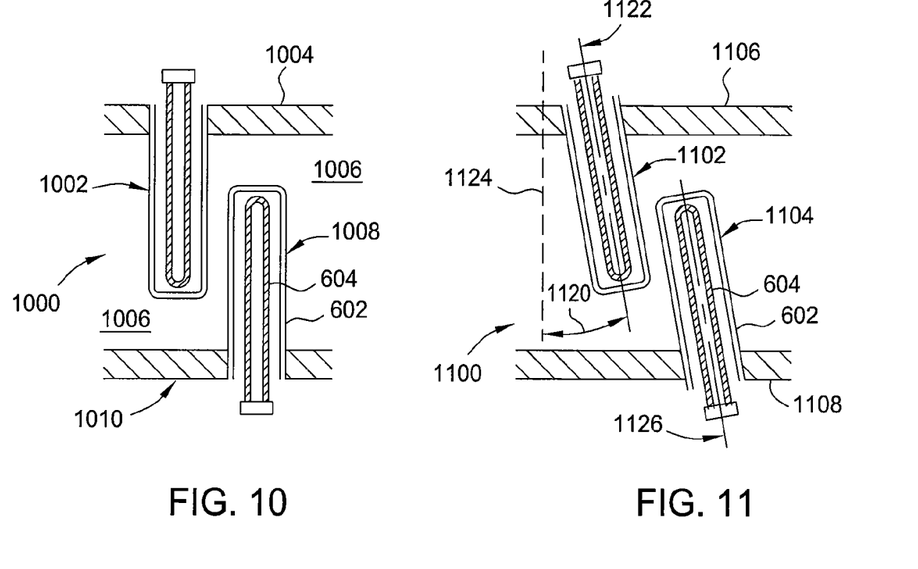

FIGS. 9-11 are partial sectional views of different embodiments of a load lock chamber having a plurality of lamp assemblies supported therein. Generally, the embodiments of FIGS. 9-11 have the lamp assemblies arranged in a manner that enhances substrate temperature uniformity.

In the embodiment depicted in FIG. 9, a partial sectional view of a load lock chamber 900 is illustrated having a first plurality of lamp assemblies 902 extending from a first sidewall 904 into a chamber volume 906 and a second plurality of lamp assemblies 908 extending from a second and opposing sidewall 910 into the chamber volume 906. The lamp assemblies 902, 908 are generally configured as described above.

Each pair of opposing lamp assemblies 902, 908 are generally aligned in a roughly coaxial arrangement. Lengths of adjacent first lamp assemblies 902 extending from the first sidewall 904 into the chamber volume 906 are selected such that the ends 912 of the first lamp assemblies 902 are staggered, e.g., extend different distances into the chamber volume 906. Likewise, lengths of adjacent second lamp assemblies 908 extending from the second sidewall 910 into the chamber volume 906 are selected such that the ends 914 of the second lamp assemblies 908 are staggered different distances into the chamber volume 906 such that each pair of facing ends 912, 914 are offset a different distance from the first wall 904 than the adjacent facing pair of ends 912, 914. This staggered arrangement of the facing ends 912, 914 of the lamp assemblies 902, 908 prevents a large linear low temperature region from forming on the substrate below the ends 912, 914 of the lamp assemblies 902, 906 in a straight line down the center of the substrate.

In the embodiment depicted in FIG. 10, a partial sectional view of a load lock chamber 1000 is illustrated having a first plurality of lamp assemblies 1002 extending from a first sidewall 1004 into a chamber volume 1006 and a second plurality of lamp assemblies 1008 extending from a second and opposing sidewall 1010 into the chamber volume 1006. The lamp assemblies 1002, 1008 are generally configured as described above.

Each pair of opposing lamp assemblies 1002, 1008 are generally aligned in an axial offset arrangement. The first lamp assemblies 1002 extend from the first sidewall 1004 more than half the distance across the chamber volume 1006. The second lamp assemblies 1008 also extend from the second sidewall 1010 more than half the distance across the chamber volume 1006. The lengths are selected such that the ends 1012, 1014 of adjacent lamp assemblies 1002, 1008 are overlapped, e.g., the ends 1012, 1014 of adjacent lamp assemblies 1002, 1008 extend beyond each other. In this staggered and offset arrangement, the area of low heat transfer present between ends 1012, 1014 of adjacent lamp assemblies 1002, 1008 is staggered so that temperature uniformity of the substrate being heated by the lamp assemblies 1002, 1008 is increased.

In the various embodiments described above, the lamp assemblies are generally orientated in a perpendicular relationship to wall of the load lock chamber from which they extend. However, the lamp assemblies may alternatively be orientated at an actuate angle relative to the wall of the load lock chamber from which they extend. For example, in the embodiment depicted in FIG. 11, angled lamp assemblies 1102, 1104 extending from opposing sidewalls 1106, 1108 of a load lock chamber 1100 may be at an angle 1120. The angle 1120 may be defined between a centerline 1122 of the lamp assembly 1102 and an imaginary line 1124 having a perpendicular orientation to the wall 1106. In one embodiment, the angle 1120 may be about one to about 30 degrees, such as about one to about 10 degrees or about one to five degrees. A centerline 1126 of the lamp assembly 1104 may be parallel to the centerline 1122 of the lamp assembly 1102. The lamp assemblies 1102, 1104 may be staggered and offset as shown in FIG. 11, coaxially staggered as shown in FIG. 9, in another arrangement. The angled lamp assemblies further blend the low heat output associated new the ends of the lamp assemblies such that the temperature uniformity of the heated substrate is enhanced.

Thus, a heated load lock chamber has been provided. The end supported lamp assembly decouples the position of the lamp from deflection experienced by the top of the chamber body when under vacuum conditions, thereby minimizing changes in the distance between the lamp and substrate during venting and vacuum cycles. Moreover, as the electrical connections of the lamps are positioned outside of the vacuum environment, arcing within the vacuum environment is eliminated. Furthermore, the opposing tube design facilitates lamp replacement without breaking vacuum even with adjacent chambers disposed in close proximity to the load lock chamber.

While the foregoing is directed to the preferred embodiment of the present invention, other and further embodiments of the invention may be devised without departing from the basic scope thereof. The scope of the invention is determined by the claims which follow.

What is claimed is:

1. A heated load lock chamber, comprising:
   a chamber body having an interior volume and at least two substrate access ports; and
   a plurality of lamp assembles extending at least partially into the interior volume of the chamber body, wherein each lamp assembly further comprises:
      a lamp; and
      a transmissive tube having an open end exposed to atmosphere outside the chamber body, the transmissive tube extending into the interior volume of the chamber body and providing a pressure barrier isolating the lamp from the interior volume of the chamber body.

2. The heated load lock chamber of claim 1, wherein the transmissive tube further comprises:
   a closed end disposed in the interior volume of the chamber body.

3. The heated load lock chamber of claim 1, wherein the transmissive tube further comprises:
   a reflective material coating an upper surface of the tube.

4. The heated load lock chamber of claim 3, wherein the reflective material further comprises gold.

5. The heated load lock chamber of claim 1, wherein the transmissive tube is fabricated from quartz.

6. The heated load lock chamber of claim 1, wherein the transmissive tube has a geometry selected to prevent collapse when the tube is surrounded by vacuum processing conditions and an interior of the tube is at substantially ambient pressure.

7. The heated load lock chamber of claim 1, wherein the lamp further comprises a carbon IR lamp.

8. The heated load lock chamber of claim 7, wherein the lamp further comprises an elongated u-shaped member.

9. The heated load lock chamber of claim 1, wherein the lamp further comprises:
   a reflective material coating an upper surface of the lamp.

10. The heated load lock chamber of claim 9, wherein the reflective material further comprises gold.

11. The heated load lock chamber of claim 1, wherein the plurality of lamp assemblies further comprises:
    a first group of lamp assemblies extending from a first wall of the chamber body; and
    a second group of lamp assemblies extending from a second wall of the chamber body, wherein first and second groups of lamp assemblies have parallel centerlines.

12. The heated load lock chamber of claim 11, wherein the centerlines of lamp assemblies are not orientated perpendicularly to an orientation of the first wall.

13. The heated load lock chamber of claim 1, wherein the plurality of lamp assemblies further comprises:
    a first lamp assembly extending from a first wall of the chamber body; and
    a second lamp assembly extending from a second wall of the chamber body, wherein the first and second lamp assemblies have a coaxial centerline.

14. The heated load lock chamber of claim 13, wherein the plurality of lamp assemblies further comprises:
    a third lamp assembly extending from the first wall of the chamber body; and
    a fourth lamp assembly extending from the second wall of the chamber body, wherein the third and fourth lamp assemblies have a coaxial centerline, and wherein ends of the first and second lamp assemblies are aligned with the ends of the third and fourth lamp assemblies.

15. The heated load lock chamber of claim 13, wherein the plurality of lamp assemblies further comprises:
    a third lamp assembly extending from the first wall of the chamber body; and
    a fourth lamp assembly extending from the second wall of the chamber body, wherein the third and fourth lamp assemblies have a coaxial centerline, and wherein ends of the first and third lamp assemblies project different distances into the chamber volume.

16. A heated load lock chamber, comprising:
    a chamber body having an interior volume and at least two substrate transfer ports;
    at least one lamp assembly comprising:
       a lamp; and
       a transmissive tube housing the lamp therein, wherein the transmissive tube further comprising:
          an open end extending through a sidewall of the chamber body, the open end of the tube sealed to the sidewall of the chamber body such that an interior of the tube is open to atmosphere; and
          a closed end extending into and surrounded by the interior volume of the chamber body, the closed end supported in a spaced-apart relation to a top of the chamber body.

17. The heated load lock chamber of claim 16, wherein a centerline of the tube has an orientation parallel to a bottom of the chamber body.

18. The heated load lock chamber of claim 17, wherein the orientation of the centerline of the tube is non-perpendicular to the wall of the chamber body from which the tube extends.

19. A heated load lock chamber, comprising:
    A) a chamber body having an interior volume defined between first and second opposing sidewalls;
    B) a plurality of first lamp assemblies supported in a parallel relationship, each first lamp assembly further comprising:
       a lamp; and
       a transmissive tube housing the lamp therein, wherein the tube comprises:
          an open end exposed to atmosphere and through which the lamp may be extracted through the first sidewall of the chamber body; and
          a closed end extending toward the second sidewall and into an interior of the chamber body, and wherein the tube provides a pressure barrier isolating the lamp from the interior volume of the load lock chamber; and C) a plurality of second lamp assemblies supported in a parallel relationship, each second lamp assembly further comprising:

a lamp; and a transmissive tube housing the lamp therein, the tube further comprising:

an open end exposed to atmosphere and through which the lamp may be extracted through the second sidewall of the chamber body; and a closed end extending toward the first sidewall and into an interior of the chamber body, and wherein the tube provides a pressure barrier isolating the lamp from the interior volume of the load lock chamber.

20. The heated load lock chamber of claim 19, wherein centerlines of the first lamp assemblies have an orientation parallel to a bottom of the chamber body; and wherein the centerline of one of the first lamp assemblies is coaxial with a centerline of one of the second lamp assemblies.

21. The heated load lock chamber of claim 19, wherein the closed ends of the first lamp assemblies are aligned.

22. The heated load lock chamber of claim 19, wherein the closed ends of the first lamp assemblies are staggered.

23. The heated load lock chamber of claim 19, wherein the first lamp assemblies and the second lamp assemblies interleave.

24. The heated load lock chamber of claim 19, wherein the first lamp assemblies and the second lamp assemblies are arranged in orientation non-parallel to the wall of the chamber body from which the respective lamp assembly extends.

25. The heated load lock chamber of claim 24, wherein the first lamp assemblies and the second lamp assemblies interleave.

* * * * *